United States Patent [19]

Boeck

[11] Patent Number: 4,794,617
[45] Date of Patent: Dec. 27, 1988

[54] EXTERNAL OPTICAL RESONATOR FOR A SEMICONDUCTOR LASER

[75] Inventor: Georg Boeck, Munich, Fed. Rep. of Germany

[73] Assignee: Siemens Aktiengesellschaft, Berlin and Munich, Fed. Rep. of Germany

[21] Appl. No.: 906,503

[22] Filed: Sep. 12, 1986

[30] Foreign Application Priority Data

Sep. 25, 1985 [DE] Fed. Rep. of Germany ....... 3534190
Jan. 13, 1986 [DE] Fed. Rep. of Germany ....... 3600726

[51] Int. Cl.$^4$ .......................... H05B 7/14; G02B 6/10
[52] U.S. Cl. .................................... 372/92; 350/96.12;
350/96.15; 350/96.16; 372/6; 372/98; 372/99
[58] Field of Search ............... 350/96.12, 96.15, 96.16;
372/92, 98, 108, 94, 99, 6

[56] References Cited

U.S. PATENT DOCUMENTS

| | | | |
|---|---|---|---|
| 4,107,628 | 6/1978 | Hill et al. | 372/6 |
| 4,145,457 | 3/1979 | Kersten | 350/96.15 |
| 4,469,397 | 9/1984 | Shaw et al. | 350/96.15 |
| 4,483,583 | 11/1984 | Unger | 350/96.15 |
| 4,673,270 | 6/1987 | Gordon | 350/96.15 |

OTHER PUBLICATIONS

R. Wyatt et al. "10 kHz Linewidth 1.5 μm InGaAsP External...", Elec. Lett., vol. 19, #3 (Feb. 3, 1983) pp. 110–112.
E.-J. Bachus et al. "Polarisation-Maintaining Single-Mode...", Elec. Lett., vol. 19, #24 (Nov. 24, 1983) pp. 1027–1028.
F. Favre et al. "Emission Frequency Stability in Single-Mode...", Elec. Lett., vol. 19, #17 (Aug. 18, 1983) pp. 663–665.
L. F. Stokes et al. "All-Single-Mode Fiber Resonator", Optical Society of Amer., vol. 7, #8 (Jun. 1982) pp. 288–290.

Primary Examiner—William L. Sikes
Assistant Examiner—Georgia Y. Epps
Attorney, Agent, or Firm—Hill, Van Santen, Steadman & Simpson

[57] ABSTRACT

An external optical resonator for use with a semiconductor laser has a high selectivity and phase steepness for the input reflection factor in the region of the resonance frequency and is highly stable. An optical directional coupler is coupled to the semiconductor laser and two gates of the coupler are connected to one another by a radiation transmission path for externally transmitting radiant power. The coupling factor of the directional coupler is selected such that the radiation coupled into one waveguide of the coupler is nearly completely coupled over to the other waveguide of the coupler. Nearly complete suppression of all secondary modes is obtained by using a wavelength selective directional coupler in place of a broad band directional coupler.

27 Claims, 6 Drawing Sheets

EXTERNAL OPTICAL RESONATOR FOR A SEMICONDUCTOR LASER

BACKGROUND OF THE INVENTION

1. Field of the Invention

The present invention relates to an external optical resonator for use with semiconductor lasers.

2. Description of the Prior Art

Single mode semiconductor laser transmitters having very small line widths are required for use in coherent optical transmission systems. Since the diode lasers presently availalle do not have the requisite narrow line widths, additional external measures are generally required to achieve the desired spectral properties. One such measure is to couple an external resonator to the laser for linewidth narrowing applying free beam propagation. For example, see the publication R. Wyatt, W. J. Devlin, "10 kHz. Linewidth 1.5 $\mu$m InGaAs External Cavity Laser with 55 nm Tuning Range", 19 Electr. Lett. 110–112 (1983). The structure disclosed in the publication has inadequate stability and involves a considerable expense. Further, the risk of mode hopping is possible with such structure as a result of the periodic resonance structure of the Fabry-Perrot resonator used therein.

The risk of mode hopping is also present in a corresponding structure formed in fiber technology, such as disclosed in F. Favre, D. Le Guen, "Emission Frequency Stability in Single-Mode-Fibre Optical Feedback Controlled Semiconductors Lasers", 19 Electr. Lett. 663–665 (1983). Additional frequency selectivity is also lacking in the structure disclosed in the latter publication.

Additional publications disclosing narrow selection curves are L. F. Stokes, M Chodorow, H. J. Snow, "All-single-mode fibre resonator", 7 Optics Lett. 288–290 (1982) and E. J. Bachus, R. P. Braun, B. Strebel, "Polarisation-maintaining single mode fibre resonator", 19 Electr. Lett. 1027–1028 (1983). An optical waveguide having a defraction grating is disclosed in W. V. Sorin, H. J. Schaw, "A Single-Mode Fiber Evanescent Grating Reflector", Vol. LT-3, No. 5, J. of Lightwave Technology (Oct. 1985).

SUMMARY OF THE PRESENT INVENTION

An object of the present invention is to provide high selectivity and phase steepness for the input reflection factor in the area of the resonance frequency of a resonator.

The principles of the present invention are embodied in an optical four-gate or port coupler having a first gate or port couplable to a semiconductor laser so that radiation power from the spectral range emitted by the semiconductor laser is coupled in through the first gate and is only slightly coupled over to a second gate of the coupler but is nearly completely coupled over to a third gate of the coupler. A fourth gate of the coupler is provided so that radiant power from the spectral range of the laser couple thereinto is nearly completely coupled over onto the second gate and is only slightly coupled over onto the third gate. Further, radiant power from the spectral range of the laser which has been coupled into the second gate is coupled onto the first gate by a radiation transmission path connected between the second gate and the fourth gate. The radiation transmission path is an optical waveguide which transmits externally of the coupler the radiant power between the second and fourth gate of the coupler. A back-coupling means or feedback arrangement for coupling a defined component of the radiant power coupled out of the second gate and transmitted over the radiation transmission path is provided. The back-coupling means or feedback arrangement back-couples the radiant power into the second gate.

The resonator of the present invention enables narrow selection curves to be achieved which previously were only achieved for the transmission factor as disclosed in the above-identified Stokes et al. and Bachus et al. publications and which are, however, unsuitable as external optical resonators for semiconductor lasers.

Slight over-coupling from one gate onto another is defined herein as meaning that less than half of the incoupled radiant power is coupled over, while nearly complete over-coupling from one gate to another is defined as more than one-half of the in-coupled radiant power being coupled over. It is preferable that the degree of over-coupling provided in the present device not be in the 50% range. In fact, the coupler preferably couples between 95% and 100% of the radiant power in the spectral range coupled in through the first gate over onto the second gate. Further, the coupler couples between 95% and 100% of the radiant power coupled into the fourth gate over onto the second gate.

The resonator of the present invention is formed of a four-gate coupler which, in some embodiments, has a broad bandwidth and is, thus, useful for a broad wavelength region. The four-gate coupler is formed, in other embodiments, of a wavelength selective coupler. Such a wavelength selective coupler has a significant coupling only in the spectral range emitted by the semiconductor laser, or alternately, in a narrow spectral range falling within the larger spectral range emitted by the laser. Preferably, no significant overcoupling occurs outside of the wavelength selective range, resulting in nearly complete suppression of all secondary modes through the use of the present resonator.

The coupler bandwidth should be roughly identical to the free spectral range of the resonator which is defined as the spacing between the central frequency mode and a neighboring mode. However, relatively great suppression of neighboring, or secondary modes is still obtained if the coupler bandwidth is a few times larger than the free spectral range. The selectivity of the single mode however, remains unaltered in this case.

In a selected form of the present invention, radiant power coupling over to the third gate couples out of the third gate reflection or reaction-free. Advantages are realized when the hitherto standard practice of coupling an optical waveguide to that side of the semiconductor laser facing away from the resonator is foregone. Instead, the optical waveguide is coupled to the semiconductor laser through the third gate of the directional coupler, which is the resonator side of the laser. This eliminates considerable alignment problems, since only the coupler and the semiconductor laser have to be aligned relative to one another. There are little problems in coupling the waveguide to the third gate of the coupler; the optical waveguide of the coupler and the waveguide to be coupled can even be formed in a single piece.

When, on the other hand, the waveguide to be coupled to the semiconductor laser is nonetheless coupled to the side of the semiconductor laser facing away from the resonator, it is useful to provide a reaction-free out-coupling of the radiant power from the third gate of the coupler. In particular, the reaction-free out-coupling at the third gate is provided by a radiation absorber which absorbs the out-coupled radiant power.

The coupler, which is either a wavelength selective coupler or a broad band coupler, is generally an optical directional coupler and can either be an optical fiber coupler or can be formed as an integrated coupler.

The radiation transmission path can either be a glass fiber, particularly when the resonator is a glss fiber device, or the radiation transmission path can be an integrated optical waveguide preferably for use with an integrated coupler to provide a compact, structure for the present invention. Provided an integrated waveguide is used, one embodiment is formed in a glass substrate by an ion exchange method.

Of special importance in the present device is the back-coupling means which has a significant influence on the behavior of the present resonator. Part of the radiant power coupled out of the second gate and transmitted over the radiation transmission path is coupled back from the back-coupling means into the second gate. The resulting input reflection factor can be changed greatly from under critical to greatly overcritical output responses by varying the amount of feedback.

The back-coupling means is easy to form structurally when it is a partially transmissive reflector. The amount of the radiant power coupled out from the second gate which is coupled back into the second gate is defined by the reflection factor r of the reflector. The partially transmissive reflector can be formed by a refractive index discontinuity which is determined by the relationship $r=(n_1-n_2)^2/(n_1+n_2)^2$ for $n_1$ and $n_2$ denoting the effective refractive indices of the two adjacent media and thereby defining the discontinuity.

The refractive index discontinuity can be in the form of a glass lamina having a thickness of a few tens through one hundred wavelengths thick, the glass lamina being arranged in the radiation transmission path. Alternately, the refractive index discontinuity can be an immersion fluid or it can be in the form of an end face coupling of two optical waveguides having different refractive indices. In another form, the partially transmissive reflector is realized by vapor deposited layers.

Advantages are realized in the present invention when the suppression of neighboring modes to the central mode in the region of the resonance frequency is provided by a frequency-selective back-coupling means. Such frequency-selective means is formed by a defraction grating structure on an optical waveguide. An optical waveguide having a defraction grating structure is disclosed in W. V. Sorin, H. J. Schaw, "A Single-Mode Fiber Evanescent Grating Reflector", LT- 3, No. 5, J. of Lightwave Technology, October 1985.

Preferably, the back-coupling means is disposed between the second and fourth gate of the four-gate coupler and with an optical waveguide coupled thereto. Two or more back-coupling devices may be arranged in the transmission path, resulting in the suppression of neighboring modes while the selectivity of the individual mode is not influenced. The back-coupling means is expediently spaced from the second and fourth gates of the coupler. In a specific embodiment of the present resonator, the back-coupling means is spaced from the second and fourth gates by a distance from the second gate of three-fourths of the overall length of the radiation transmission path. When a single back-coupling means is used, it is also located in the same place.

An external optical resonator embodying the objects of the present invention provides doubled free spectral range for identical resonator lengths over the known resonators. Furthermore, the use of wavelength selective directional couplers and/or a wavelength selective back-coupling means prevents the problem of periodic reflectivity which is present in the known resonators.

DESCRIPTION OF THE PREFERRED EMBODIMENTS

Figure 1:
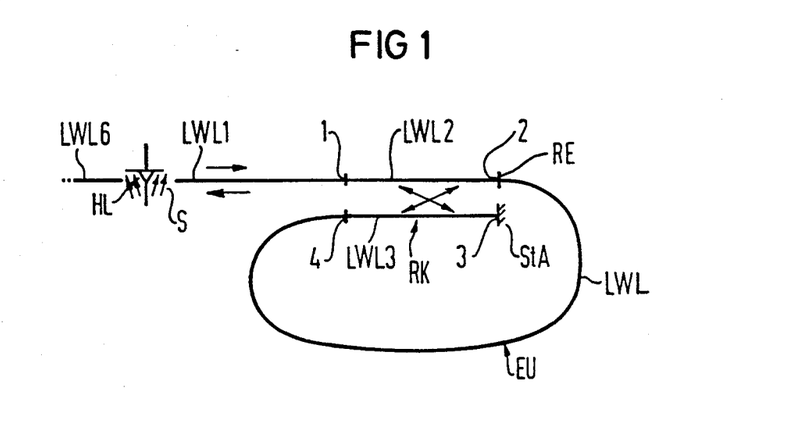
FIG. 1 shows a schematic diagram of an optical resonator with a radiation transmission path acoording to the principles of the present invention.

With reference first to FIG. 1, a semiconductor laser HL is, for example, a laser diode and emits radiation S to the right, which is coupled into a light waveguide LWL1 which conducts the radiation therefrom to an optical directional coupler RK. A light waveguide LWL6 for coupling to the semiconductor laser HL is coupled for radiation reception to the left-hand side of the semiconductor HL facing away from the directioaal coupler RK.

The directional coupler RK is formed of two closely adjacent parallel light waveguides LWL2 and LWL3 having a defined length and between which in-coupled radiation crosses over. The coupling degree, or factor, is defined in part by the common length of the two light waveguides LWL2 and LWL3. The ends of the two light waveguides LWL2 and LWL3 define the four gates 1, 2, 3, and 4 of the coupler RK.

The coupling factor of the directional coupler RK is selected so that radiant intensity coupled into an arbitrarily selected first gate of the coupler RK couples only between 0 to 5% of the radiation over into the gate 2 at the other end of the corresponding light waveguide LWL2. Between 95% to 100% of the radiant energy is coupled over into the gate 3 at the other end of the light waveguide LWL3. The analogous case applies for every other arbitrarily selected gate. For instance, radiant energy coupled into the fourth gate 4 at one end of the light waveguide LWL3 only couples between 0 to 5% over into the third gate 3 at the other end of the light waveguide, whereas between 95% to 100% of the radiant power is coupled over into the second gate 2 at the other end of the other light waveguide LWL2.

For the resonator of FIG. 1 having a radiation S coupled into the first gate 1, the light waveguides LWL1 and LWL2 are composed of one piece.

A radiation transmission path EU connects gates 2 and 4 to one another for coupled external transmission of radiant power between the second and fourth gates 2 and 4. The radiation transmission path EU is composed of a light waveguide LWL in the illustrated embodiment, which has each of its ends coupled to the respective gates 2 and 4.

A back-coupling device RE is arranged between the gate 2 and the end of the light waveguide LWL opposite the gate 2. The back-coupling device RE back-couples defined components of the radiant power coupled out of the gate 2 and transmitted into the gate 4 through the light waveguide LWL back into the second gate 2 and, thus, into the light waveguide LWL2.

The back-coupling device RE can take any of several forms. In FIG. 1, the back-coupling device RE is shown as a glass lamina having a eefined reflection factor r.

The radiation coupled out of the third gate 3 is nearly completely absorbed by a radiation absorber, StA, so that a nearly reaction-free out-coupling ensues at the third gate 3. The more reaction-free the out-coupling is, the better.

The light waveguide LWL1, LWL2, LWL3, and LWL are formed of glass fibers. However, they can also be entirely or partially integraeed light waveguides. In particular, the light waveguide LWL in an alternate embodiment is formed of a light waveguide integrated in a glass plate, which has been manufactured by means of an ion exchange method.

Figure 2:
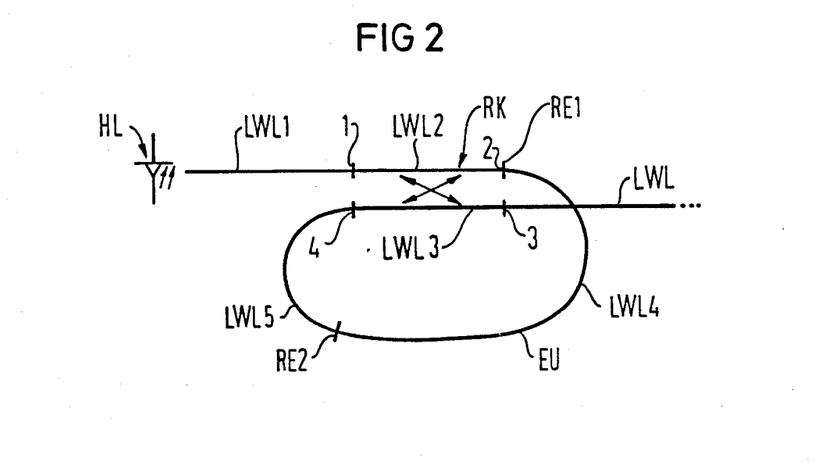
FIG. 2 shows schematically another embodiment of the present resonator.

The embodiment shown in FIG. 2 differs from the embodiment of FIG. 1 in that two back-coupling devices RE1 and RE2 are disposed in the radiation transmission path EU at a distance from one another. Secondly, the light waveguide LWL6 to be coupled to the semiconductor laser HL is coupled to the third gate 3 of the directional coupler RK, eliminating the radiation absorber. This type of coupling can also be used in the embodiment of FIG. 1. The light waveguides LWL3 and LWL6 cnn be formed of one piece.

The back-coupling devices both have the same reflection factor so that they both conduct the same amount of the radiation back. The back-coupling devices can be generated in a very simple way when the external radiation transmission path EU is formed of two light waveguides LWL4 and LWL5 which have different refractive indices. The light waveguides LWL, LWL2, LWL3, and LWL5 are preferably formed of light waveguides having the same refractive index and the light waveguide LWL4 is formed of a light waveguide having a different refractive index so that the two back-coupling units RE1 and RE2 are realized simply by the refractive index discontinuity at the end face of the coupled light waveguides LWL2 and LWL4 and at the end face of the waveguides LWL4 and LWL5. The light waveguides LWL4 and LWL5 can be either glass fibers or integrated light waveguides.

In the embodiment of FIG. 2, the lengths of the light waveguides LWL4 and LWL5 are specifically selected so that the light waveguide LWL4 occupies three-fourths of the overall length of the radiation transmission path EU, with the light waveguide LWL5 occupying the remaining one-fourth of the radiation transmission path EU. The radiation transmission path has an annular appearance in the illustrated embodiment and, thus, also may be called a ring resonator.

The properties of the resonator shown in FIGS. 1 and 2 will now be set forth in detail with reference to the wavelength dependency of the amplitude and phase of the input reflection factor $S_{11}$ in the region of the resonance frequency, the properties being compared with those of a traditional known straight resonator. The graphs of FIGS. 3 through 10 show the input reflection factors and the phases dependent on the wavelength about the zero point for the wavelength of resonance.

Figure 3:
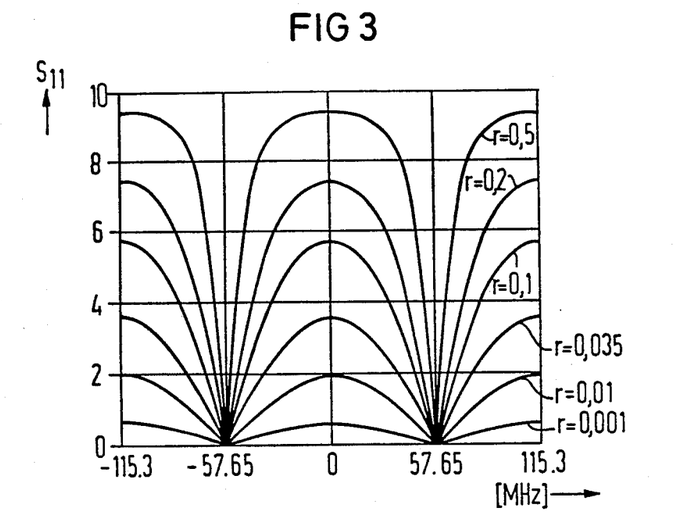
FIG. 3 is a graph showing the wavelength dependency of the input reflection factor $S_{11}$ for a straight resonator having a length of 0.9 m in the region of resonance for reflection factors of $r=0.001$, 0.035, 0.01, 0.2, and 0.05.
Figure 4:
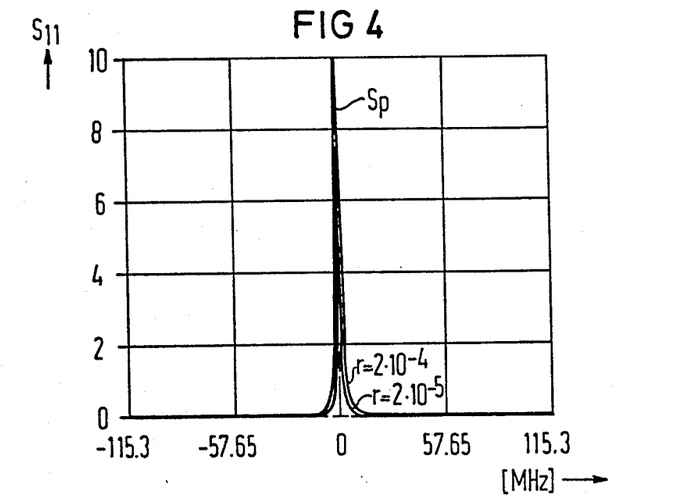
FIG. 4 is a graph of the wavelength dependency of the input reflection factor for a resonator having the radiation transmission path of FIG. 1 in the region of resonance for two different reflection factors of $r=2\times10^{-4}$ and $2\times10^{-5}$.

In FIG. 3, the relatively weak spectral selectivity of a straight resonator is shown. In comparison thereto, a far higher spectral selectivity is shown in FIG. 4 for the resonator of FIG. 1. A centrally located peak, or mode, Sp is found at the resonant wavelength in FIG. 4.

Figure 5:
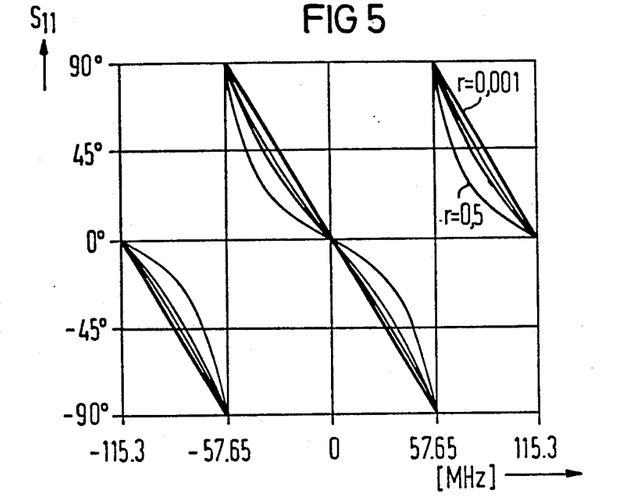
FIG. 5 is a graph showing the wavelength dependency of the phase of the input reflection factor for a straight resonator without an external transmission path.
Figure 6:
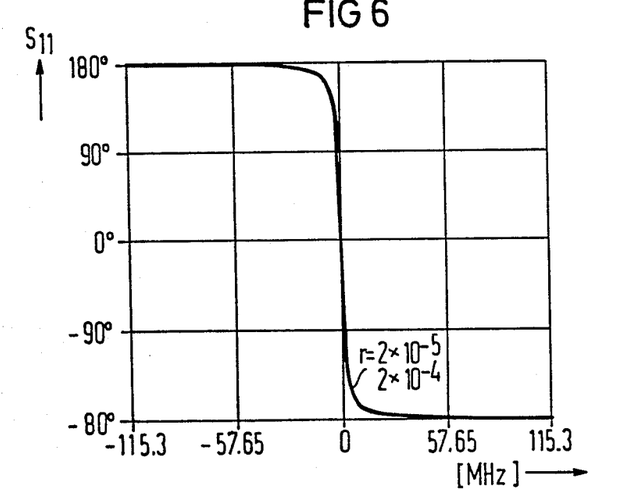
FIG. 6 is a graph for comparison to that of FIG. 5 showing the wavelength dependency of the phase of the input reflection factor for a resonator having an external radiation transmission path of Figure.

The phase of the reflection factor of a straight resonator is shown in FIG. 5 for comparison to the graph of FIG. 6 in which the phase curves of the resonator of FIG. 1 are shown. A considerably higher phase steepness in the region of the resonance frequency results from the provision of the radiation transmission path. Moreover, the phase curves of both reflection factors $r = 2 \times 10^{-4}$ and $r = 2 \times 10^{-5}$ practically coincide in accordance with the graph of FIG. 6.

Figure 7:
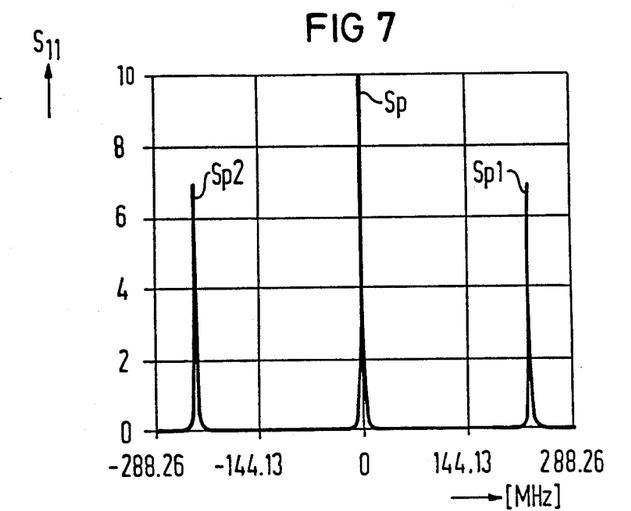
FIG. 7 is a graph showing the wavelength dependency of the amplitude of the input reflection factor for a resonator as shown in FIG. 2 having a reflection factor r of $2\times10^{-4}$ in the region of resonance wherein neighboring modes to the central mode are partially suppressed.

Secondary or neighboring signal modes adjacent the central mode found at the resonant wavelength are partially suppressed with the resonator of FIG. 2, as can be seen by reference to FIG. 7. Peaks Sp1 and Sp2 correspond to the two neighboring modes that lie to the left and right, respectively, of the central mode Sp at the resonant wavelength. The peaks Sp1 and Sp2 are noticeably lower in amplitude than that for the central mode peak Sp.

Figure 8:
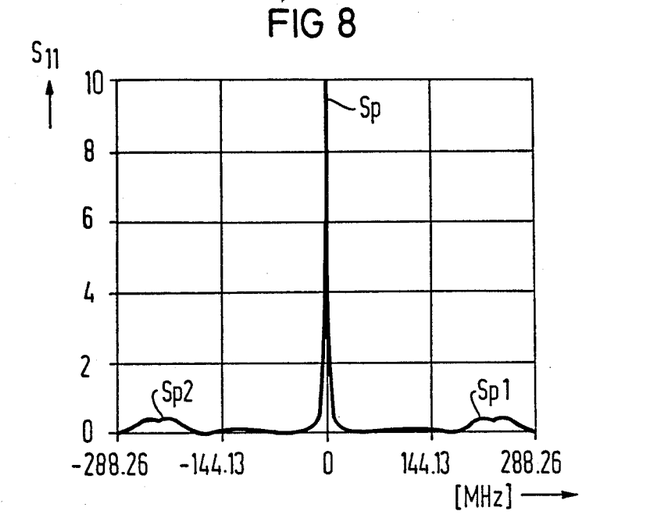
FIG. 8 is a graph showing the wavelength dependency of the amplitude of input reflection factor for the resonator of FIG. 1 which includes a wavelength selective directional coupler in the region of resonance, the bandwidth being roughly equal to the mode spacing for the free spectral range of the resonator.

The secondary modes for a resonator as shown in FIGS. 1 and 2 can be nearly completely suppressed by using a wavelength selective directional coupler instead of a broad band directional coupler. Referring to FIG. 8, a signal mode graph for a resonator is shown wherein the bandwidth of the coupling factor of the wavelength selective directional coupler at the resonant wavelength of the resonator is selected to be approximately identical to the free spectral range. In other words, the coupler bandwidth is equal to the spacing between the central mode Sp and a neighboring modes. As a result thereof, the neighboring modes Sp1 and Sp2 are nearly entirely suppressed.

Figure 9:
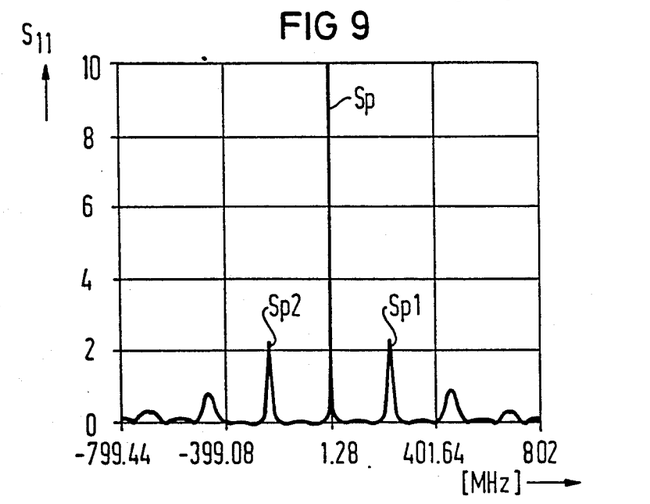
FIG. 9 is a graph of the wavelength dependency of the amplitude of the input reflection factor for a resonator as shown in FIG. 1 and having a wavelength selective directional coupler with a wavelength of approximately three times the mode spacing of the resonator.

As can be seen in FIG. 9, also for a three times larger bandwidth of the selective wavelength coupler, a relatively great suppression of the secondary modes is still obtained. The selectivity of the central mode remains unaltered in this case.

Figure 10:
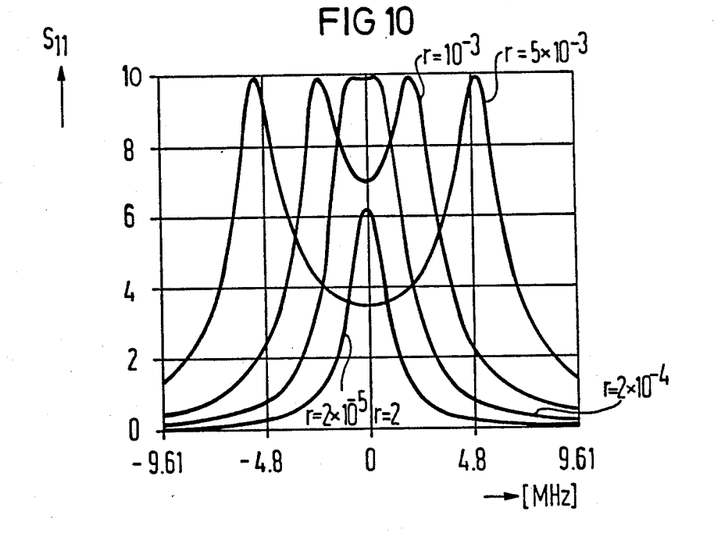
FIG. 10 is a graph of the resonant spectra of the amplitude of the input reflection factor for the resonator of FIG. 1 for various reflection factors.

As shown in FIG. 10, the influence of the reflection factor r on a shaped curve of the input reflection factor $S_{11}$ of the resonator is shown as a function of the wavelength. The curves for the reflection factors $r=2\times 10^{-5}$, $r=2\times 10^{-4}$, $r=10^{-3}$, and $r=5\times 10^{-3}$ are shown. Thus, the resonator of the present invention can be varied from greatly under-critical through greatly over-critical influences of the input reflection factor $S_{11}$.

Enlarged detail drawings of a variety of back-coupling devices RE are shown in the circular excerpts 10 of FIGS. 11 through 15. In general, the optical light waveguides LWL2 and LWL are core-cladded glass fibers having cores $K_2$, or K, surrounded by claddings $M_2$, or M, respectively. The waveguides LWL2 and LWL can instead be integrated strip waveguides, where the cores $K_2$ or K are strip waveguides and $M_2$ or M indicate the substrate on which the waveguides are integrated.

Figure 11:
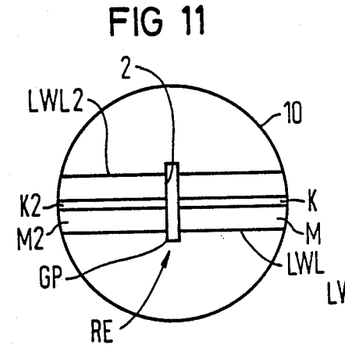
FIGS. 11 through 15 are enlarged details of various embodiments of back-coupling means for use in the device of FIG. 1.

Firstly, in the embodiment shown in FIG. 11, the back-coupling device RE is a partially trnnsmissive reflector in the form of a glass lamina GP, defining a refractive index discontinuity and mounted between the light waveguides LWL2 and LWL. The glass lamina TP has a thickness of between a few tens through one hundred wavelengths thick.

Figure 12:
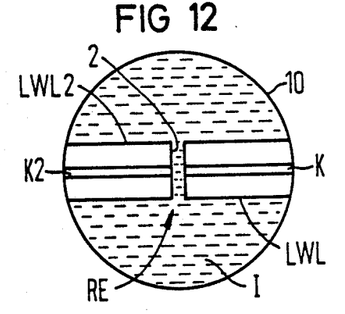
Figure 13:
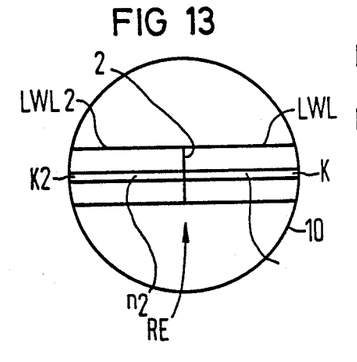

Referring now to FIG. 12, the refractive index discontinuity RE is formed by an immersion fluid I between the waveguides LWL2 and LWL. In FIG. 13, the refractive index discontinuity RE is defined by an end face coupling of the two waveguides LWL2 and LWL having mutually different refractive indices $n_2$ and n, respectively.

Figure 14:
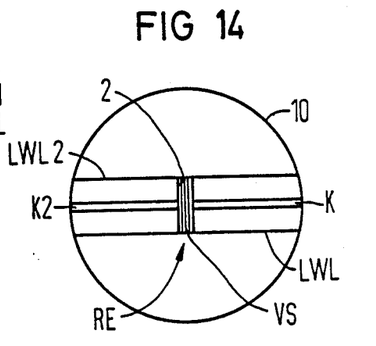
Figure 15:
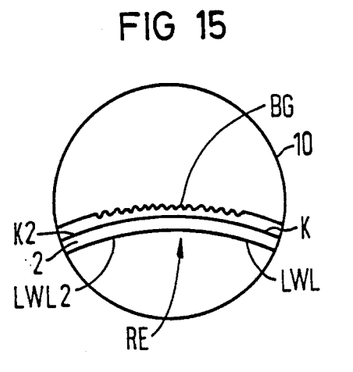

In FIG. 14, the refractive index discontinuity RE is formed by vapor deposited layers VS. The layers may, for example, be dielectric multiple layers which have a frequency-selective effect. A frequency-selective back-coupling device is illustrated in FIG. 15 in the form of a defraction grating structure BG on the waveguide LWL. While FIGS. 11 through 15 show embodiments for the back-coupling device RE, the various means of realizing a back-coupling device as shown can also be utilized for the back-coupling devices RE1 and RE2.

Although modifications and changes may be suggested by those skilled in the art, it is the intention of the inventor to embody within the patent warranted hereon all changes and modifications as reasonably and properly come within the scope of his contribution to the art.

I claim as my invention:

1. An external optical resonator for a semiconductor laser, comprising:
   an optical four-gate coupler having:
      a first gate couplable to the semiconductor laser so that radiant power from said laser that is coupled into said first gate is no more than five percent coupled to a second gate and is at least ninty-five percent coupled to a third gate,
      a fourth gate of said coupler being such that radiant power coupled in through said fourth gate is at least ninty-five percent coupled to said second gate and is no more than five percent coupled to said third gate,
      said second gate being such that radiant power coupled in through said second gate is coupled to said first gate,
   a radiation transmission path connected between said second gate and said fourth gate for transmission of radiant power between said second gate and said fourth gate externally of said coupler, said radiation transmission path being formed by an optical waveguide,
   a feedback device disposed between said second gate and said fourth gate for reflecting a predetermined amount of radiant power coupled out of said second gate and transmitted over the radiation transmission path back into said second gate.

2. An external optical resonator as claimed in claim 1, wherein said coupler is a broad band coupler.

3. An external optical resonator as claimed in claim 1, wherein said coupler is a wavelength-selective coupler.

4. An external optical resonator as claimed in claim 1, wherein radiant power coupling to said third gate couples out of said third gate reaction-free.

5. An external optical resonator as claimed in claim 4, further comprising:
   a radiation absorber for absorbing out-coupled radiant power disposed for effecting said reaction-free out-coupling from said third gate.

6. An external optical resonator as claimed in claim 1, further comprising:
   a second optical waveguide for coupling to the semiconductor laser being coupled to the semiconductor laser by said third gate of said coupler.

7. An external optical resonator as claimed in claim 1, wherein said coupler is an optical directional coupler.

8. An external optical resonator as claimed in claim 7, wherein said optical directional coupler is a glass fiber directional coupler.

9. An external optical resonator as claimed in claim 8, wherein said optical waveguide of said radiation transmission path is a glass fiber.

10. An external optical resonator as claimed in claim 7, wherein said optical directional coupler is an integrated coupler.

11. An external optical resonator as claimed in claim 10, wherein said optical waveguide of said radiation transmission path is an integrated waveguide.

12. An external optical resonator as claimed in claim 1, wherein said optical waveguide of said radiation transmission path is a glass fiber.

13. An external optical resonator as claimed in claim 1, wherein said optical waveguide of said radiation transmission path is an integrated waveguide.

14. An external optical resonator as claimed in claim 13, wherein said integrated waveguide is formed in a glass substrate by an ion exchange method.

15. An external optical resonator as claimed in claim 1, wherein said back-coupling device is a partially transmissive reflector.

16. An external optical resonator as claimed in claim 15, wherein said partially transmissive reflector is formed by a refractive index discontinuity.

17. An external optical resonator as claimed in claim 16, further comprising:
   a glass lamina having a thickness in the range of from a few tens through one hundred wavelengths of the radiant power from said laser to form said refractive index discontinuity.

18. An external optical resonator as claimed in claim 16, further comprising:
an immersion fluid forming said refractive index discontinuity.

19. An external optical resonator as claimed in claim 16, wherein said refractive index discontinuity is formed by an end face coupling of two optical waveguides having mutually different refractive indices.

20. An external optical resonator as claimed in claim 16, further comprising:
vapor-deposited layers forming said partially transmissive reflector.

21. An external optical resonator as claimed in claim 1, wherein said feedback device has a frequency-selective effect.

22. An external optical resonator as claimed in claim 21, further comprising:
a defraction grating structure formed on an optical waveguide forming said feedback device.

23. An external optical resonator as claimed in claim 1, wherein said feedback device is disposed between said second gate and said optical waveguide coupled to said second gate.

24. An external optical resonator as claimed in claim 1, wherein said back-coupling device is disposed between said fourth gate and said optical waveguide coupled to said fourth gate.

25. An external optical resonator as claimed in claim 1, further comprising:
at least two feedback devices disposed in said radiation transmission path.

26. An external optical resonator as claimed in claim 25, wherein one of said at least two feedback devices is at a distance from said second gate and at a distance from said fourth gate.

27. An external optical resonator as claimed in claim 26, wherein said one feedback device is at a distance from said second gate of three-fourths the length of said radiation transmission path, a second of said feedback devices also being at the same point.

* * * * *